United States Patent [19]

Krech, Jr. et al.

[11] Patent Number: 5,796,288

[45] Date of Patent: Aug. 18, 1998

[54] GRAPHICS ACCELERATOR HAVING MINIMAL LOGIC MULTIPLEXER SYSTEM FOR SHARING A MICROPROCESSOR

[75] Inventors: Alan S. Krech, Jr.; Brian C. Miller, both of Fort Collins, Colo.

[73] Assignee: Hewlett-Packard Company, Palo Alto, Calif.

[21] Appl. No.: 730,170

[22] Filed: Oct. 15, 1996

Related U.S. Application Data

[63] Continuation of Ser. No. 441,859, May 16, 1995, abandoned.

[51] Int. Cl.$^6$ .................................................. H03K 17/693
[52] U.S. Cl. ............................ 327/407; 327/99; 327/408
[58] Field of Search ............................. 327/407–413, 327/99; 370/112, 540

[56] References Cited

U.S. PATENT DOCUMENTS

| | | | |
|---|---|---|---|
| 4,593,390 | 6/1986 | Hildebrand et al. | 370/112 |
| 4,718,063 | 1/1988 | Reedy et al. | 327/407 |
| 4,910,466 | 3/1990 | Kiuchi et al. | 327/407 |
| 4,985,703 | 1/1991 | Kaneyama | 327/408 |
| 5,295,174 | 3/1994 | Shimizu | 327/407 |
| 5,311,517 | 5/1994 | Senoo | 327/407 |
| 5,355,035 | 10/1994 | Vora et al. | 327/408 |
| 5,406,607 | 4/1995 | Marietta | 327/407 |
| 5,446,321 | 8/1995 | Yoshino et al. | 327/408 |
| 5,463,326 | 10/1995 | Raje | 327/409 |
| 5,475,324 | 12/1995 | Tomiyori | 327/99 |

FOREIGN PATENT DOCUMENTS

4126408  4/1992  Japan ................................. 327/99

*Primary Examiner*—Timothy P. Callahan
*Assistant Examiner*—Eunja Shin

[57] ABSTRACT

A minimal logic multiplexer system using tri-state drivers with one-hot enabling lead, provides high-speed access to processor elements by any one of a plurality of control units. The multiplexer system is implemented in a manner that minimizes the circuit implementation, minimizes gate delay within the circuit implementation, and allows processing instructions to pass from a control unit to the processor elements by way of multiplexed control lines therebetween. The multiplexer system contains control unit gate groups that are enabled and disabled in parallel by a select lead. Each control unit gate group can be implemented internal to the respective control unit or external in a common intermediary multiplexer circuit location.

7 Claims, 8 Drawing Sheets

GRAPHICS ACCELERATOR HAVING MINIMAL LOGIC MULTIPLEXER SYSTEM FOR SHARING A MICROPROCESSOR

CROSS REFERENCE TO RELATED APPLICATION(S)

This is a continuation of copending application Ser. No. 08/441,859 filed on May 16, 1995, now abandoned.

BACKGROUND OF THE INVENTION

1. Field of the Invention

This invention relates to multiplexer systems, and in particular, to a minimal logic multiplexer system for control units sharing control line access to a micro-processor.

2. Description of the Related Art

It is a problem in the field of high-performance graphics accelerator circuits in three-dimensional imaging devices, to implement an efficient minimal logic multiplexer system for control units that share control line access to processor elements within a micro-processor. The need to implement an efficient minimal logic multiplexer system exists due to the increasingly limited circuit space available in graphics accelerator circuits as circuit implementations continue to grow in size and underlying chip designs continue to shrink.

It is common in micro-processor based architectures for the microprocessor itself to contain a set of general purpose processor elements including, but not limited to, an arithmetic/logic unit (ALU), registers, a multiplier, a divider, and Random Access Memory (RAM) work space. The processor elements are typically shared by a plurality of specialty control units. Each control unit is capable of directing the processing activities of individual processor elements to accomplish specific computational tasks. To provide the processor elements access to each control unit, adequate control line connectivity and access control must be established between the processor elements and each control unit.

One solution to providing control line connectivity is to use dedicated control lines between the processor elements and each control unit. The dedicated control line solution is manageable for small numbers of control units and control lines, although the solution quickly becomes unmanageable as the number of control units and control lines increases. In addition, the space required to physically connect each control line to its respective processor element and control unit, can also be a limiting factor for this solution. For reasons the dedicated control line solution is undesirable in a limited circuit space environment.

Another solution to providing control line connectivity is to multiplex the control lines between each control unit and the processor elements. An enable lead in the multiplexer is used to control which one control unit is allowed access to the processor elements at the appropriate time. A significant problem with multiplexer access, however, is the number of gate levels required by the traditional multiplexer implementation. Specifically, the logic used to implement a traditional multiplexer is a primarily NAND gate hierarchical structure that rapidly grows in gate level depth for each additional control line being multiplexed. A factor contributing to the number of gates required per control line is that the enabling leads for each gate are included as input to the gate logic rather than merely serving as a gate enabler. Further, the number of gates and gate levels contributes to a significant timing problem due to gate delay. Because potentially hundreds of control lines can require multiplexing between each control unit and each processor element, traditional multiplexer access is too large and slow for a limited circuit space environment.

Therefore, existing control line connectivity and multiplexer design solutions fail to connect each processor element to each control unit with the minimal logic and minimal circuitry necessary in a limited circuit space environment. The existing need for a minimal logic circuit implementation for sharing control lines has heretofore not been satisfied.

SUMMARY OF THE INVENTION

The above-described problems are solved and a technical advance achieved in the field by the minimal logic multiplexer system of the present invention. The present invention uses tri-state drivers with a one-hot enabling lead to fully connect each processor element with each control unit in a manner that minimizes the circuit implementation, minimizes gate delay, and allows a coded control signal to pass to the processor elements by way of the respective control lines.

Tri-state multiplexers minimize the circuit implementation by requiring only one tri-state driver (gate) per control line. This results in a flat, nonhierarchically structured gate implementation that experiences minimal gate delay. Each gate in the tri-state multiplexer is a NOT gate that is enabled and disabled by way of a select lead controlled by a multiplexer control unit. The select lead is not used as a logic input to the gate. The truth table for a single gate in the tri-state multiplexer is that of an ordinary NOT gate when the gate is enabled. A high impedance output is produced at all times when a gate is disabled, regardless of the gate's logic input. The impedance level must be sufficient to produce an open circuit appearance that allows an enabled gate to drive the accompanying control line without conflict. The multiplexer control unit controls which control unit is active and which control unit gate group is enabled, depending on the graphic primitive type being processed.

Note that the tri-state multiplexer does more than simply multiplex signals. The tri-state multiplexer enables access for a single control unit to control all control lines for all processor elements, thereby preventing any other control unit from accessing the processor elements until the controlling control unit's access is disabled. Control units waiting for access to the processor elements are free to perform other processing tasks that do not require the processor elements in the meantime.

In a first tri-state multiplexer embodiment, the group of gates associated with any one control unit, otherwise known as a "control unit gate group," are located in an intermediary multiplexer circuit between the control units and the elements. A common select lead is shared in parallel by all gates in any one control unit gate group.

In another tri-state multiplexer embodiment, each control unit gate group is located in its respective control unit thereby eliminating the need for routing control lines to an intermediary multiplexer circuit. The multiplexer control unit continues to enable each control unit gate group as previously discussed.

In either of the above embodiments, the multiplexers can enable control unit access to an individual processor element, or simultaneously to all processor elements as a matter of design choice. The preferred embodiment in the present invention provides access to all processor elements by one control unit at a time.

DESCRIPTION OF THE PREFERRED EMBODIMENT

Figure 1:
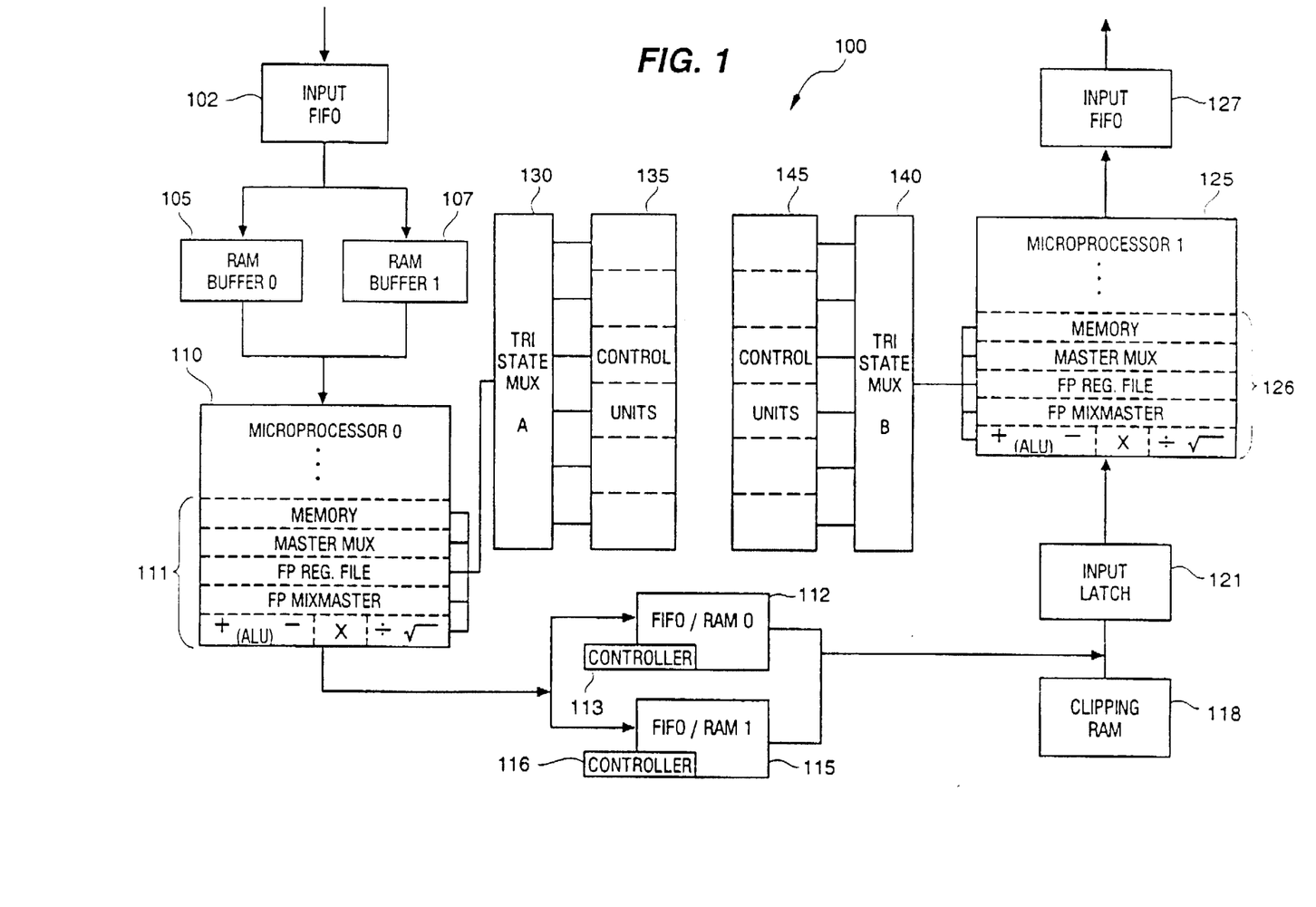
FIG. 1 illustrates a graphics accelerator architecture containing a tri-state multiplexer system in block diagram form.

Graphics Accelerator Architecture—FIG. 1

FIG. 1 illustrates a graphics accelerator architecture 100 used in threedimensional imaging devices. Architecture 100 is an example for illustration only and is not a limitation on the present invention.

Traditional graphics accelerators are floating point intensive architectures implemented in software and/or as general micro-coded processors. The fundamental difference between architecture 100 and traditional graphic accelerator architectures is that architecture 100 contains hard-wired control features, dynamic logic floating point mega-cells, and highly customized fixed control lines. Specifically, the present architecture is designed to perform geometric matrix transformations, polygon decompositions, object lighting/shading, clipping, perspective adjustments, and plane/slope equation calculations on randomly oriented polygons and/or vectors in a control unit controlled vector processing environment. The typical polygon processed by the present architecture 100 is a three or four sided polygon.

Architecture 100 is not designed to process all three-dimensional primitives. Instead, the architecture supports a larger overall three-dimensional image processing scheme by quickly and efficiently breaking down and processing only the most common primitives having the most commonly processed features to facilitate further processing by downstream hardware within the three-dimensional system. By vector processing only the most common primitives with a control unit controlled two micro-processor architecture 100, a smaller more efficient high performance three-dimensional imaging system is realized. However, it is the control unit assisted vector processing environment with minimal circuit space and maximum performance requirements that creates the need for the minimal logic multiplexer system of the present invention.

Architecture 100 is a two-processor vector processing design having a first micro-processor 110 and a second micro-processor 125. Operationally, the first micro-processor 110 pre-processes vertex primitives input by way of a traditional FIFO 102. Dual RAM buffers 105 and 107 provide a staging area from which primitives are accessed by micro-processor 110. Micro-processor 110 performs initial floating point operations on input primitives including, but not limited to, geometric transformations, partial slope calculations, and other preliminary calculations prior to handing the results off to micro-processor 125 by way of memory devices 112 and 115. Micro-processor 110 contains a plurality of processor elements 111 including, but not limited to, registers, RAM memory, an ALU, a multiplier, and a divider.

Tri-state multiplexer 130 controls access to processor elements 111 within micro-processor 110, by way of control units 135. Processor elements 111 process data as part of the processing flow through micro-processor 110 subject to processing instructions from control units 135 including, but not limited to, address decoding, transformation, decomposition, and lighting assistance.

Memory devices 112 and 115 are controlled by memory controllers 113 and 116, respectively, which implement a hybrid FIFO/RAM memory scheme. Depending on the primitive type and the operations being performed, memory devices 112 and 115 are used in a modified FIFO or RAM configuration.

Primitives output from memory devices 112 and 115 are integrated with light position, intensity, color, and direction output from the clipping RAM staging device 118. The combined data is directed into an input latch queue 121 for processing by micro-processor 125. Micro-processor 125 contains its own processor elements 126 including, but not limited to, registers, RAM memory, an ALU, a multiplier, and a divider. Tri-state multiplexer 140 controls access to processor elements 126 within micro-processor 125. Processor elements 126 process data as part of the processing flow through microprocessor 125 subject to processing instructions by control units 145 including, but not limited to, lighting, clipping, and plane equation processing assistance. Processing output from micro-processor 125 is output on a traditional FIFO queue 127 for subsequent processing by downstream hardware beyond the scope of this disclosure.

Figure 2:
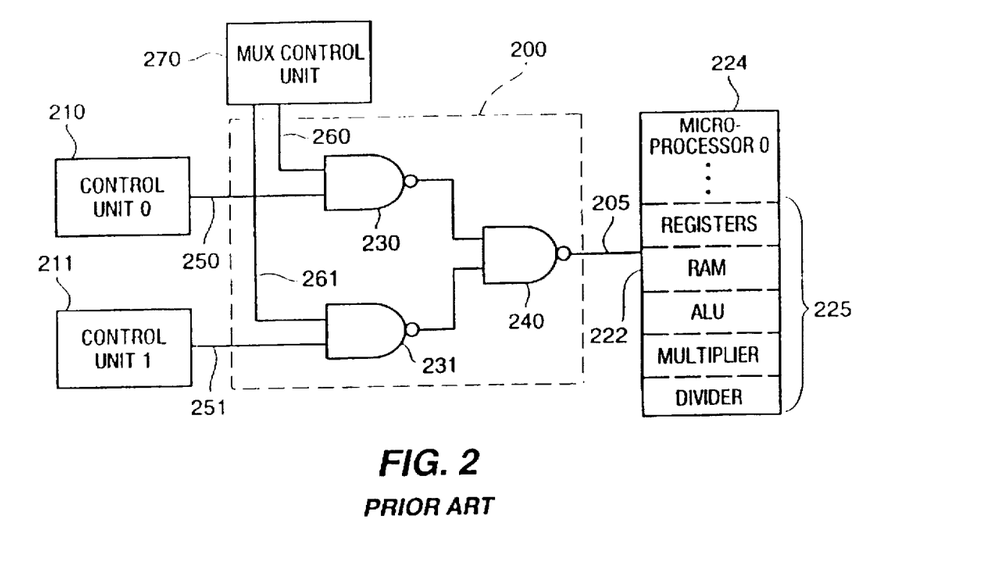
FIG. 2 illustrates a prior art multiplexer gate implementation for two control units in block diagram form.
Figure 3:
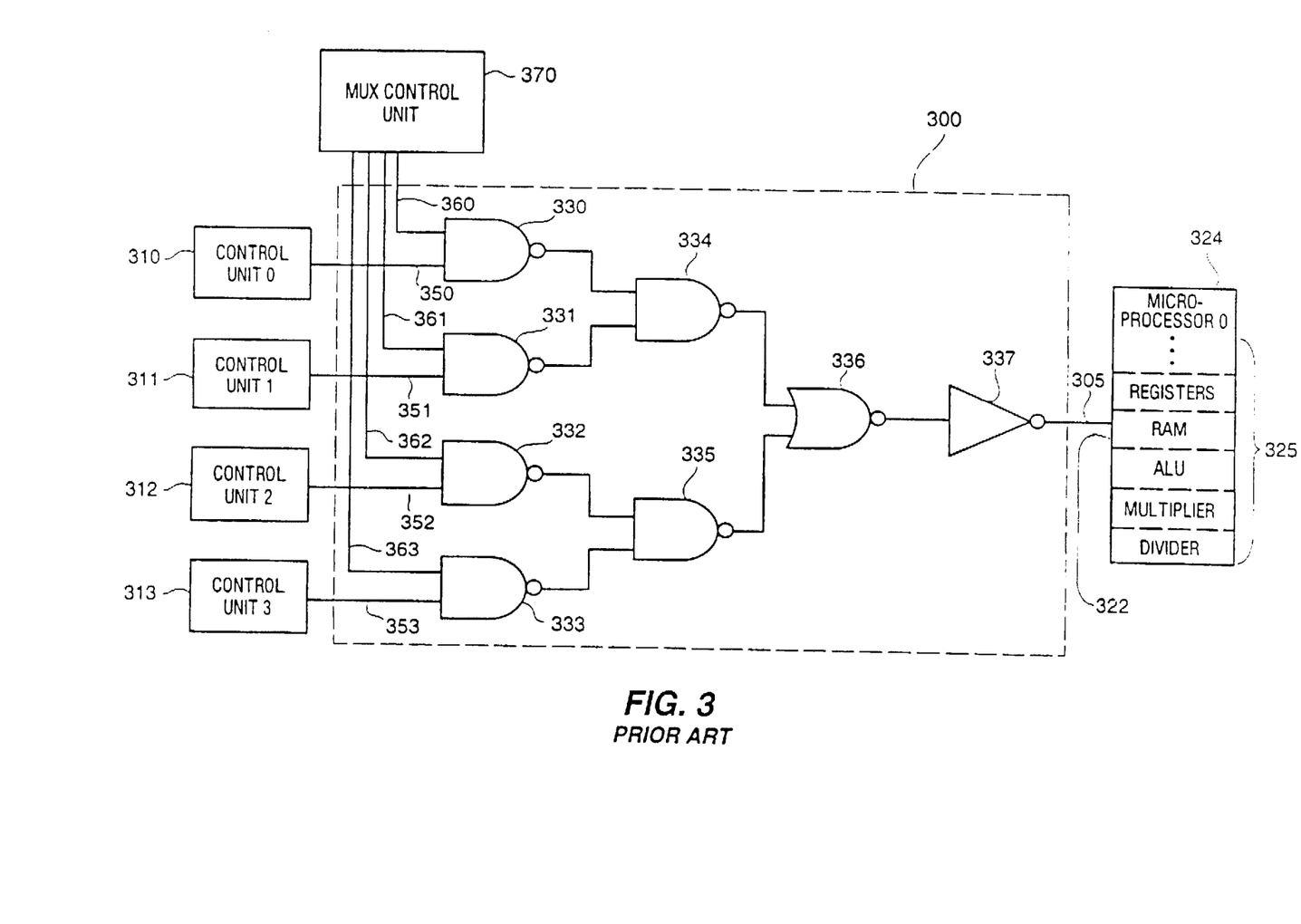
FIG. 3 illustrates a prior art multiplexer gate implementation for four control units in block diagram form.

Traditional Multiplexer Gate Implementation—FIGS. 2 and 3

FIG. 2 illustrates a traditional NAND gate multiplexer implementation 200 well-known in the art. Multiplexer implementation 200 makes a single control line 205 accessible to either one of two control units 210 and 211. Control line 205 is connected to processor element 222 from among several processor elements 225 within micro-processor 224. The traditional NAND gate multiplexer implementation 200 contains a hierarchical gate implementation including first level gates 230 and 231, and second level gate 240. Gates 230 and 231 have two inputs each including a control unit input 250 and 251 from control units 210 and 211 respectively, and a select lead 260 and 261 from multiplexer control unit 270. Because the first level gates 230 and 231, respectively, accept the select leads 260 and 261 as gate input, a second level gate 240 is required to reduce the outputs from gates 230 and 231 to the single control line 205. The second level gate 240 increases the amount of circuitry required to implement the multiplexer in addition to reducing circuit efficiency by adding a gate delay.

FIG. 3 (located after FIG. 4) illustrates the logic gate impact to NAND gate multiplexer implementation 200 by merely expanding the accessibility of a single control line 305 to any one of four control units 310–313. Control line 305 is connected to a single processor element 322 from among several processing elements 325 within micro-processor 324. The four control unit NAND gate multiplexer implementation 300 contains an even more complex hierarchical gate implementation including first level gates 330–333, second level gates 334–335, a NOR gate 336 to distinguish the outputs from second level gates 334–335, and finally a NOT gate 337 to flip the NOR gate 336 output to something understandable to processor element 322. As with FIG. 2, each first level gate 330–333 has two inputs each including a control unit input 350–353 from control units 310–313, respectively, and a select lead 360–363 each from multiplexer control unit 370. Because the first level gates 330–333 accept the select leads 360–363 as gate input, second and subsequent level gates 334–337 are needed to finally connect with the single control line 305. Given the present gate logic complexity involved in having eight gates 330–337 share control line 305 among four control units 310–313, attempting to share hundreds of control lines among multiple control units would be unmanageable in an environment having limited circuit space and high speed processing requirements that do not tolerate multiple level gate delays.

Figure 4:
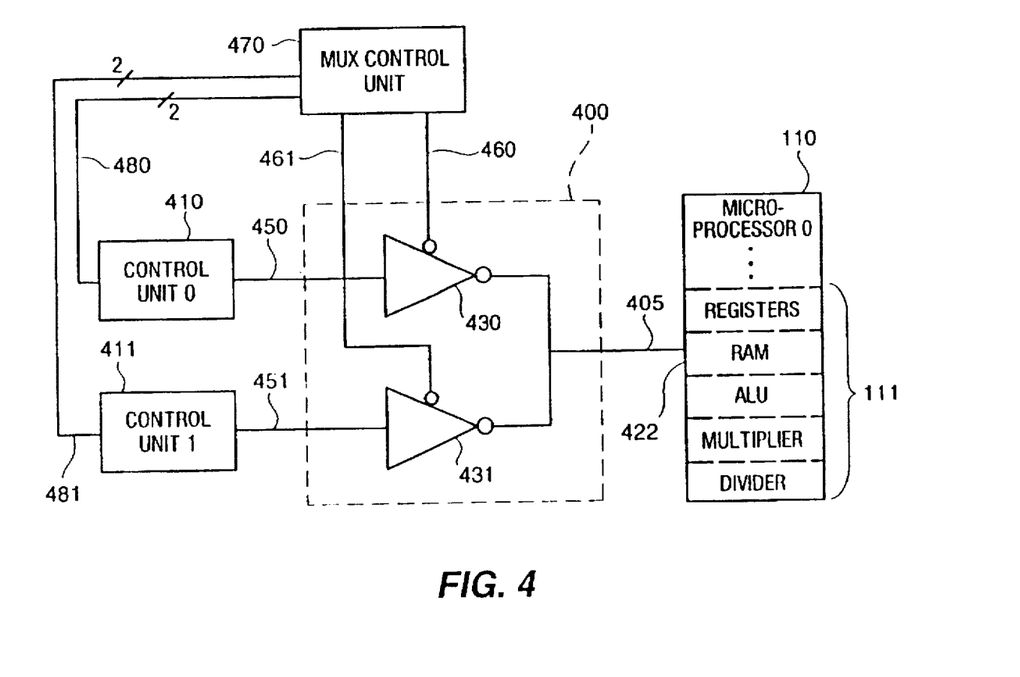
FIG. 4 illustrates a tri-state multiplexer gate implementation for two control units in block diagram form.
Figure 5:
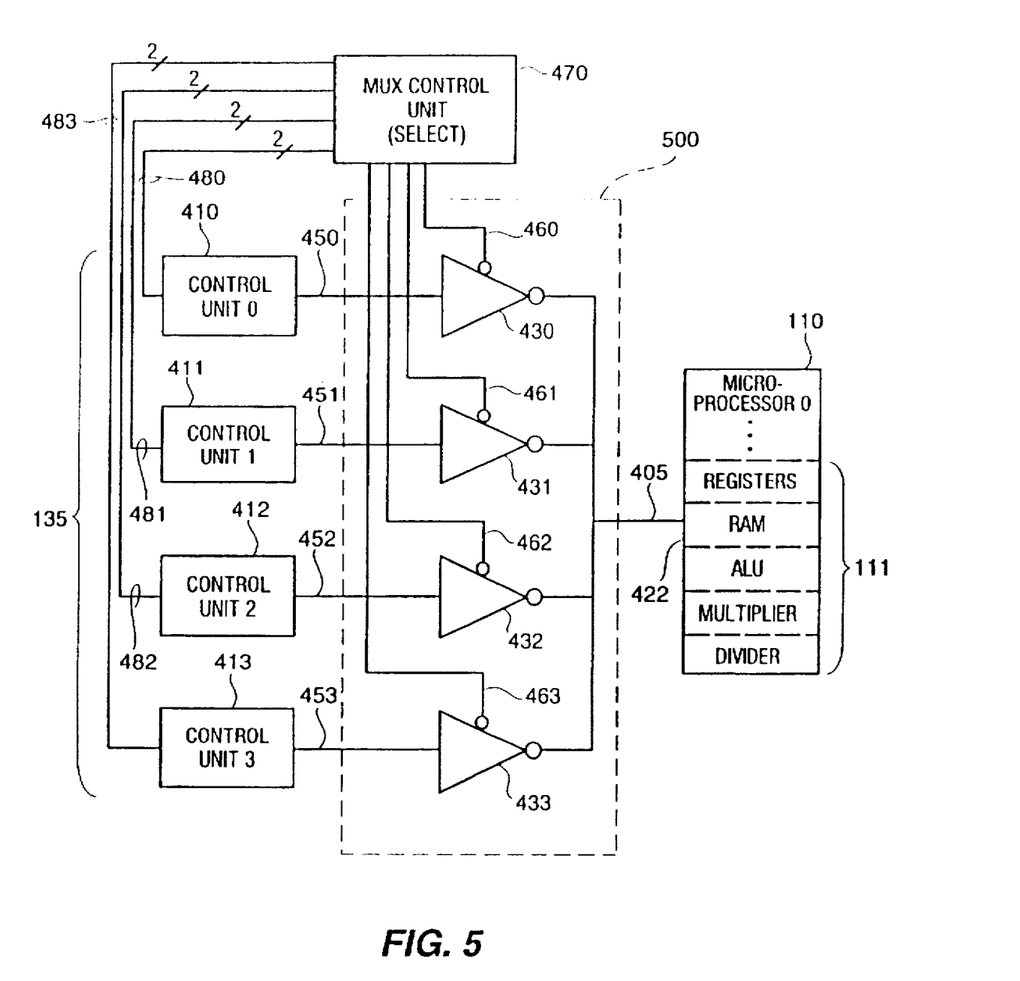
FIG. 5 illustrates a tri-state multiplexer gate implementation for four control units in block diagram form.

Tri-state Multiplexer System Gate Implementation—FIGS. 4 and 5

FIG. 4 (located on the same page as FIG. 2) illustrates a preferred tri-state multiplexer gate implementation 400. Gate implementation 400 is comparable to gate implementation 200 in that it makes a single control line 405 accessible to either one of two control units 410 and 411. Control line 405 is connected to one processor element 422 from among several processor elements 111 within microprocessor 110. Micro-processor 110 was selected for use in the present example for illustration purposes only. The present invention is equally applicable to microprocessor 125 and its accompanying control units 145.

Tri-state multiplexer gate implementation 400 contains a flat, non-hierarchical gate implementation including NOT gates 430 and 431. No hierarchical gate levels are necessary. Gates 430 and 431 each have one logic input 450 and 451 from control units 410 and 411 respectively. Select leads 460 and 461 are controlled by multiplexer control unit 470 and serve only to enable or disable each gate 430 and 431. Because select leads 460 and 461 serve only to enable or disable gates 430 and 431, rather than become mixed as logic input into either gate 430 and 431, control information can be passed through control line 405 to the processor element 422 provided that either gate 430 or 431 is enabled. The truth table for an enabled gate is that of an ordinary NOT gate. A disabled gate produces a high impedance output regardless of the gate's logic input. The impedance level that is output must be sufficient to produce an open circuit appearance that allows an enabled gate to drive the accompanying control line without conflict. Because the processor elements 111 in micro-processor 110 can require tens of control lines each, and each control unit 410–411 requires access to all control lines for each of the processor elements 111 at one time, it is readily seen that gate implementation 400 is superior to the prior art gate implementation 200 due to the minimized circuit implementation size and minimized gate delay.

Multiplexer control unit 470 also controls start and stop control lead pairs 480–481 for respective control units 410–411. The control lead pairs 480–481 tell each control unit 410–411 when to begin performing what task in a coordinated effort to process primitives. Not every start command by multiplexer control unit 470 is accompanied with an enabled select lead 460 or 461 for the same control unit 410 or 411 because the control units can perform independent tasks that do not require processor elements 111.

FIG. 5 illustrates a tri-state multiplexer gate implementation 500 that is an expanded version of the preferred tri-state multiplexer gate implementation 400. Tri-state multiplexer gate implementation 500 is also comparable to gate implementation 300 in that it makes a single control line 405 accessible to four control units 410–413. Here, control line 405 is connected to processor element 422 from among several processor elements 111 within micro-processor 110.

Each control unit 410–413 has a single control unit input 450–453 and select lead 460–463 for each gate 430–433.

It is important to note that for one control line 405 there is one multiplexer gate 430–433 per control unit 410–413. This one to one control line to multiplexer gate relationship carries through for each individual control line that exists in tri-state multiplexer gate implementation 500. It is also important to realize that in an implementation having more than one gate associated with a control unit, the single select lead 460 connects in parallel to each gate in the control unit gate group so that all gates for control unit 410 can be enabled simultaneously at the appropriate moment. Multiplexer control unit 470 controls select leads 460–463 in addition to the start and stop control lead pairs 480–483 for each respective control unit 410–413 as previously discussed.

Figure 6:
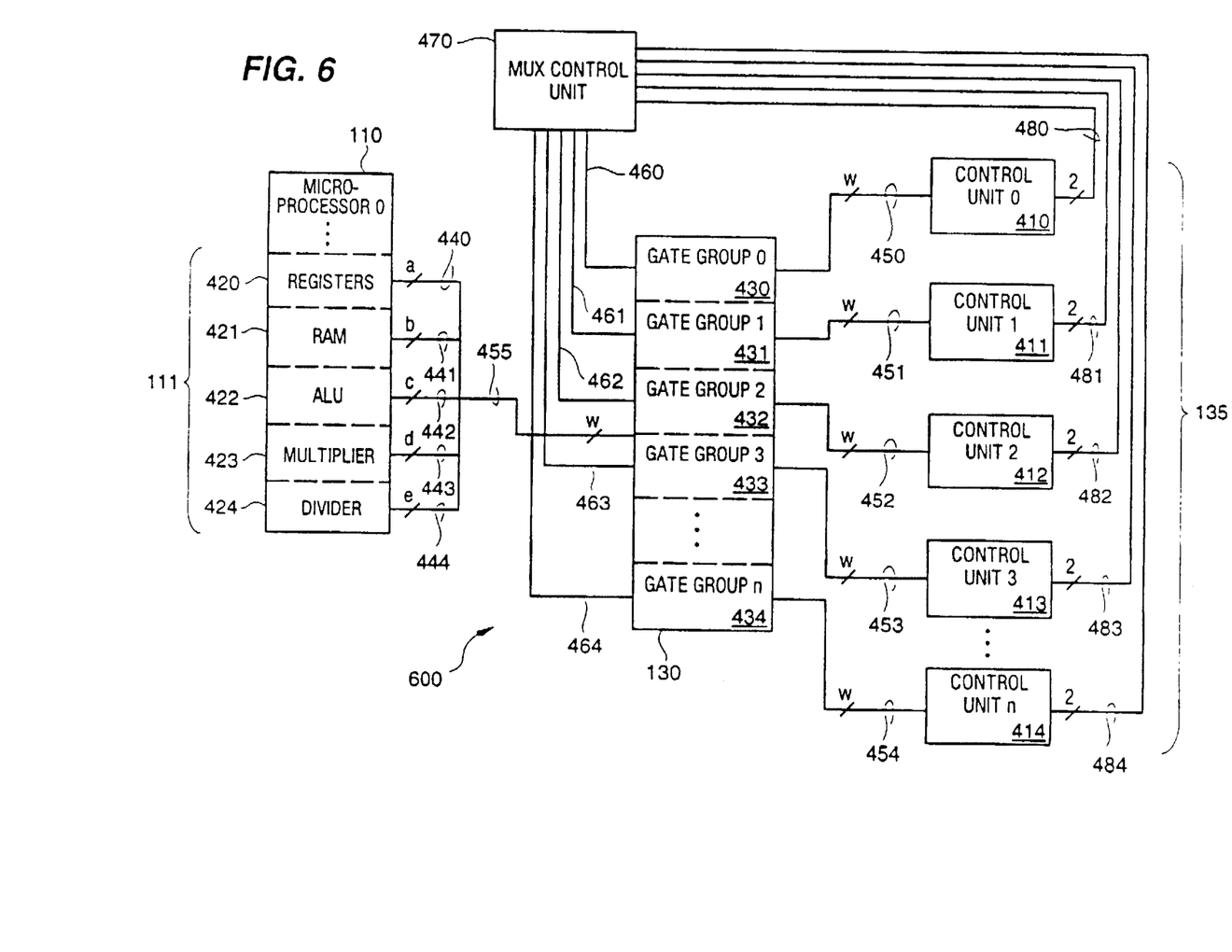
FIG. 6 illustrates an intermediary tri-state multiplexer embodiment in block diagram form.

Intermediary Tri-State Multiplexer Embodiment—FIG. 6

FIG. 6 illustrates a block diagram tri-state multiplexer implementation 600. Tri-state multiplexer 130 contains the individual multiplexer NOT gates (not shown) within control unit gate groups 430–434. The tri-state multiplexer 130 is located in an intermediate position between control units 135 and processor 111, and is connected to input control lines 450–454 from control units 410–414 and multiplexed output control lines 440–444 to processor elements 420–424.

Each individual processor element 420–424 requires a different number of control lines 440–444 by design. Processor element 420 requires "a" number of control lines 440, processor element 421 requires "b" number of control lines 441, processor element 422 requires "c" number of control lines 442, processor element 423 requires "d" number of control lines 443, and processor element 424 requires "e" number of control lines 444 respectively for a total of "w" control lines collectively. For this reason, each of the "n" individual control units 410–414 must have its own set 450–454 of "w" control lines attached thereto for each control unit 410–414 to have exclusive access to all processor elements 420–424 simultaneously. This also means that tri-state multiplexer 130 contains n*w gates each functioning in "n" control unit gate groups 430–434. Each select lead 460–464 enables and disables all gates in parallel for any one control unit gate group 430–434.

Select leads 460–464 are controlled by multiplexer control unit 470. Multiplexer control unit 470 also controls the start and stop control lead pairs 480–484 for each respective control unit 410–414 as previously discussed. The result is that each control unit 410–414 has its own complete set of "w" control lines 450–454 for use in exclusively accessing all processor elements 420–424 simultaneously, and for use in sending processing instructions to any one processor element 420–424 to direct the processing therein.

For example, if each individual processor element 420–424 requires the following numbers of control lines, 30, 20, 40, 30, and 20 respectively for control lines 440–444, then each individual control unit 410–414 requires 140 control lines in each respective set of control lines 450–454. This also means that to support full connectivity for only five control units, for example, tri-state multiplexer 130 must multiplex 700 control lines by way of 700 gates. As illustrated with the traditional NAND gate multiplexer implementations 200 or 300, well over 1400 multiplexer gates would be required resulting in at least four of gate delay, to provide the same full connectivity provided by the present invention having only one level of gate delay.

Figure 7:
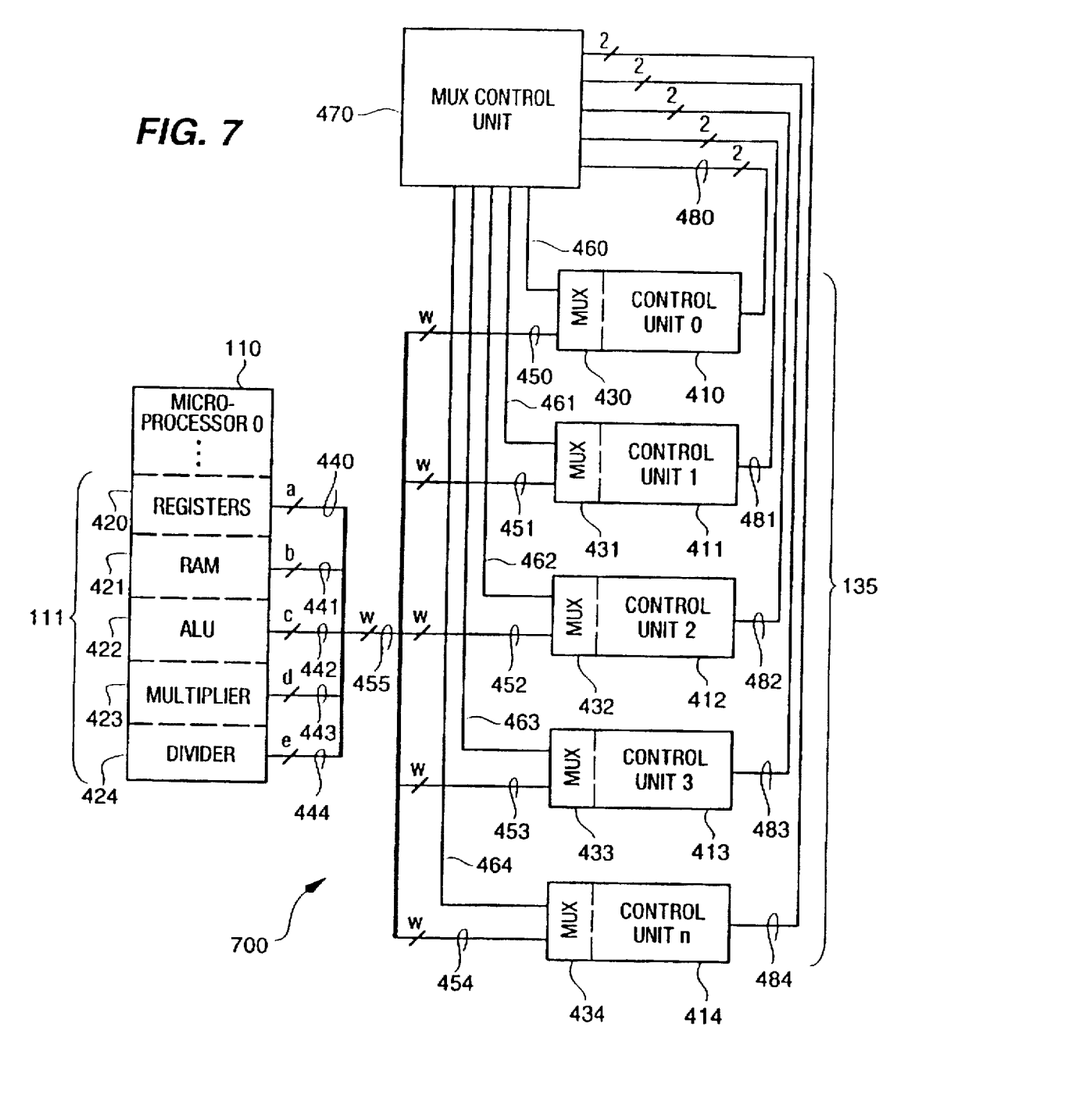
FIG. 7 illustrates a control unit based tri-state multiplexer embodiment in block diagram form.

Tri-State Multiplexer Embodiment Internal to each Control Unit—FIG. 7

FIG. 7 illustrates a tri-state multiplexer implementation 700 without tri-state multiplexer 130 in an intermediate position between control units 135 and processor elements 111. Instead, each control unit gate group 430–434 is juxtaposed to or preferably internal to the respective control unit 410–414. Multiplexer control unit 470 provides a select lead 460–464 to each control unit gate group 430–434 respectively that enables an entire group simultaneously as previously discussed. Multiplexer control unit 470 also controls the start and stop control lead pairs 480–484 for each respective control unit 410–414 as previously discussed.

The output from each control unit gate group 430–434 includes a set of "w" control lines 450–454 that join a control line bus 455 that is also "w" control lines wide. Each control line within control line bus 455 is eventually split off to the respective processor elements 420–424 of microprocessor 110, as control lines 440–444. Implementing the multiplexer logic 430–434 in each control unit 410–414 further reduces control line routing and thus the circuit space requirement in an already limited circuit space environment.

Figure 8:
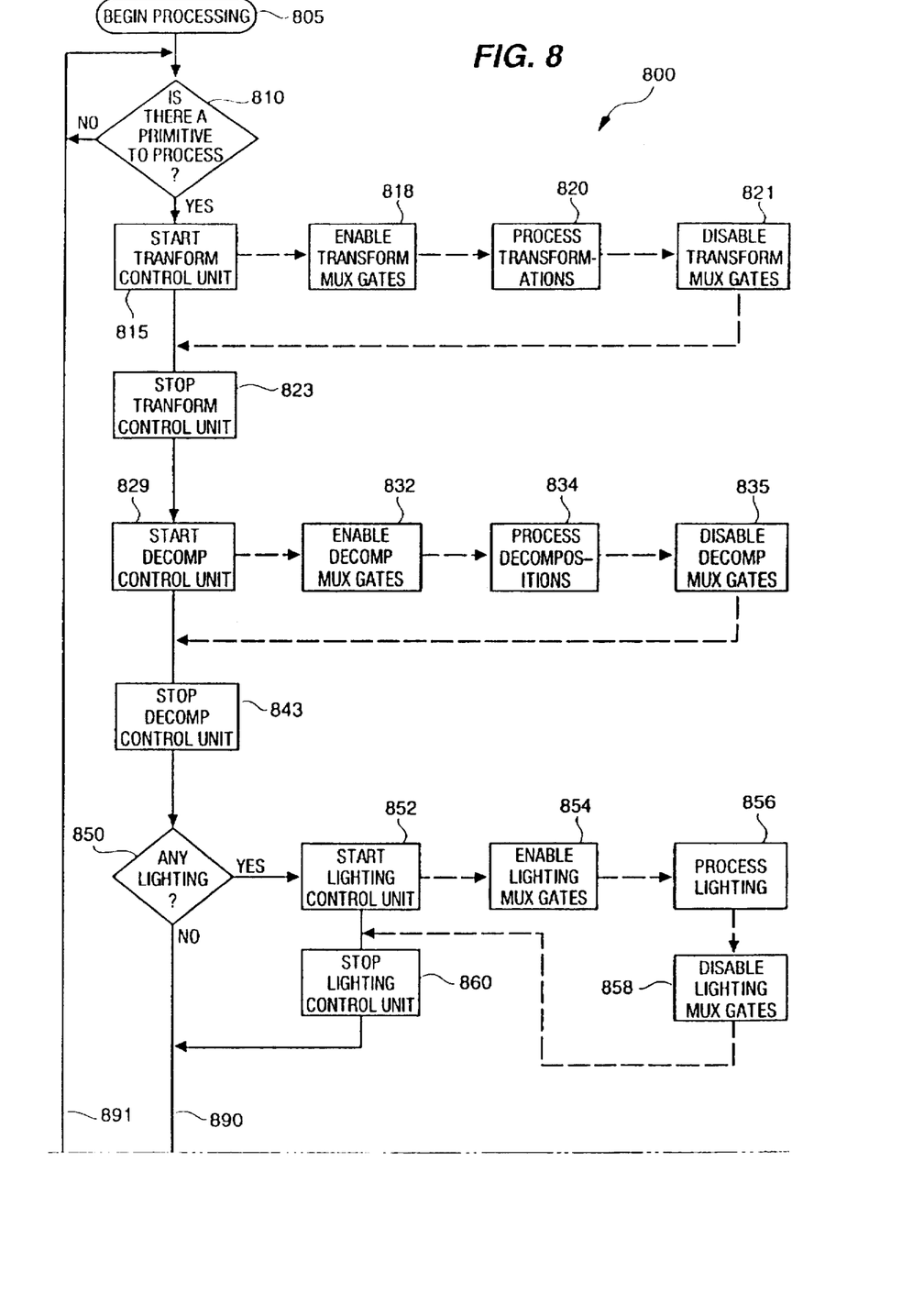
FIGS. 8 and 9 illustrate the operating steps for a tri-state multiplexer system in flow diagram form.
Figure 9:
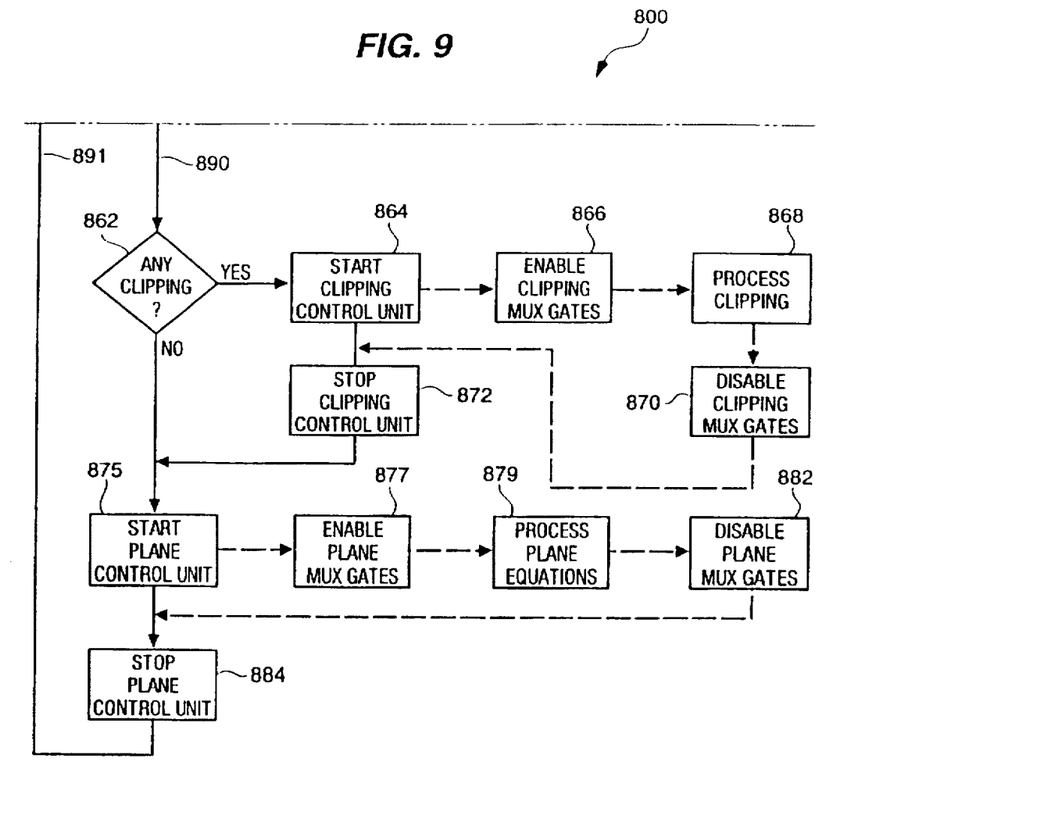

Operational Overview—FIGS. 8–9

FIGS. 8–9 illustrates an overview of the operational steps taken by either tri-state multiplexer system 600 or 700 shown in FIGS. 6 and 7. The operational steps are transparent to either of the tri-state multiplexer system embodiments disclosed in FIGS. 6 or 7. Control logic for the operational steps is located in, and controlled by, multiplexer control unit 470. For discussion purposes it is understood that the control unit functions will include transformation, decomposition, lighting, clipping, and plane equations, for control units 410–414 respectively. It is important to recognize that the tri-state multiplexer system 600 or 700 is designed to process multiple primitives simultaneously among the various control units 410–414. However, the discussion below is simplified by focusing on the processing steps that would take place for a single primitive.

Processing begins at step 805 with initialization and setup as needed by the graphics accelerator architecture 100. When a primitive is available for processing by microprocessor 110 at step 810, multiplexer control unit 470 directs the overall processing activities for the primitive by starting and stopping each respective control unit 410–414 in turn, and enabling or disabling each control unit's gate groups 430–434 as needed and as discussed below. If no primitives are available for processing at step 810 then the tri-state multiplexer system 600 or 700 waits for a primitive to arrive for processing.

When a primitive is available for processing, the transformation control unit 410 is started at step 815 to begin transforming the primitive into individual processing tasks. Optionally, the control unit gate group 430 for transformation control unit 410 is enabled at step 818 if processing by processor elements 111 is needed at step 820. When processing by processor elements 111 is complete at step 820, control unit gate group 430 is disabled at step 821. Whether or not the optional enable/disable steps 818–821 are taken, the transformation control unit 410 is stopped at step 823.

The decomposition control unit 411 is started at step 829. Optionally, if processing by processor elements 111 is needed, control unit gate group 431 is enabled at step 832. The primitive is decomposed into triangles and shape recalculations are performed on the primitive by processor elements 111 under control of decomposition control unit 411 at step 834. When processing by processor elements 111 is complete at step 834, control unit gate group 431 is disabled at step 835. Whether or not the optional enable/disable steps 832–840 are taken, the decomposition control unit 411 is stopped at step 843.

If the primitive has any lighting requirements as determined at decision block 850, then processing continues at step 852 by starting the lighting control unit 412. Optionally, if processing by processor elements 111 is needed, control unit gate group 432 is enabled at step 854, and the necessary lighting calculations proceed by way of processor elements 111 under control of lighting control unit 412 at step 856. When processing by processor elements 111 is complete at step 856, control unit gate group 432 is disabled at step 858. Whether or not optional enable/disable steps 854, 856 and 858 are taken, the lighting control unit 412 is stopped at step 860.

Continuing along line 890 to FIG. 9, if the primitive being processed has any clipping requirements at decision block 862, then processing continues at step 864 by starting the clipping control unit 413. Optionally, if processing by processor elements 111 is needed, control unit gate group 433 is enabled at step 866, and the necessary clipping calculations proceed by way of processor elements 111 under control of clipping control unit 413 at step 868. When processing by processor elements 111 is complete at step 868, control unit gate group 433 is disabled at step 870. Whether or not the optional enable/disable steps 866–870 are taken, the clipping control unit 413 is stopped at step 872.

The plane equation control unit 414 is started at step 875. Optionally, if processing by processor elements 111 is needed, control unit gate group 434 is enabled at step 877, and the necessary plane calculations proceed by way of processor elements 111 under control of plane equation control unit 414 at step 879. When processing by processor elements 111 is complete at step 879, control unit gate group 434 is disabled at step 882. Whether or not the optional enable/disable steps 877–882 are taken, the plane equation control unit 414 is stopped at step 884. Processing continues along line 891 to decision block 810 in FIG. 8 as long as primitives are available to process.

SUMMARY

The minimal logic multiplexer system is a non-hierarchical circuit implementation with minimal gate delay that accommodates electronic devices with circuit space limitations. The multiplexer system can be located between processor elements and control units, or juxtaposed to or internal to respective control units, to further minimize the circuit implementation. The multiplexer system passes processing control information to individual processor elements without using select lead inputs as logic inputs to multiplexer gates. While specific embodiments of this invention are disclosed herein, it is expected that those skilled in the art can and will design alternate embodiments of this invention that fall within the scope of the following claims.

What is claimed is:

1. A graphics accelerator comprising:
   a plurality of control units configured to generate a respective plurality of processor access signals, said control units configured to process graphics data via said processor access signals;
   a processor element having a control line, said processor element configured to execute said processor access signals to process said graphics data;
   a multiplexer control unit configured to generate a plurality of select signals;
   a plurality of logic gates equal in number to said plurality of control units with each logic gate having an input connected to a respective control unit, an output connected to said control line, and a select terminal connected to said multiplexer control unit for receiving a respective select signal;

wherein said multiplexer control unit is configured to assert one of said select signals to said select terminal of one of said logic gates so as to enable said one logic gate and to permit one control unit, which is associated with said one logic gate, to gain control of said processor element by applying said one processor access signal from said one control unit to said control line;

wherein said multiplexer control unit is configured to deassert said select signal to the select terminals of all other logic gates so as to disable all of the other logic gates and to prevent all other control units associated with the other logic gates from accessing said processor element, while said one control unit controls said processor element;

wherein said multiplexer control unit is configured to produce start signals for selectively starting said control units and to produce stop signals for selectively stopping said control units;

a second processor element having a second control line;

a second plurality of logic gates equal in number to said plurality of control units with each logic gate in said second plurality having its input connected to its respective control unit, its output connected to said second control line, and its select terminal connected to said multiplexer control unit; and wherein said multiplexer control unit is configured to enable said one control unit to gain control of said second processor element by supplying another of said select signals to another logic gate in said second plurality which is associated with said one control unit, whereby said one control unit gains control of both said processor element and said second processor element when said one logic gate and said another logic gate receive said one select signal and said another select signal respectively from said multiplexer control unit.

2. The graphics accelerator as set forth in claim 1, wherein said processor element and said second processor element comprise a portion of a microprocessor.

3. A graphics accelerator having a control system for sharing control line access to a microprocessor, comprising:

a plurality of control units, said control units configured to process graphics data;

a multiplexer control unit having a plurality of select lines equal in number to said plurality of control units, said multiplexer control unit having a plurality of start/stop lines connected respectively to said control units for controlling starting and stopping of said control units;

a processor element having a control line;

means for receiving said plurality of select lines and for selectively permitting only one of said control units at a certain time to gain control of said processor element via said control line;

a second processor element; and wherein said selectively permitting means and said multiplexer control unit enable said one control unit to gain control of said second processor at said certain time, whereby said multiplexer control unit controls selection of said one control unit with said start/stop lines and said select lines.

4. The control system as set forth in claim 3, wherein said processor element and said second processor element comprise a portion of a microprocessor.

5. The control system as set forth in claim 3, wherein said selectively permitting means comprises a plurality of logic gates equal in number to said plurality of control units with each logic gate having its input connected to its respective control unit, its output connected to said control line, and its select terminal connected to a respective select line of said multiplexer control unit.

6. The control system as set forth in claim 5, wherein only a specific logic gate which is associated with said one control unit and only said specific logic gate provides a closed circuit connection between its input and said control line.

7. The control system as set forth in claim 6, wherein all logic gates other than said specific logic gate do not receive said select signal and provide an open circuit connection between its input and said control line.

* * * * *